United States Patent
Hong

(10) Patent No.: US 6,728,125 B2
(45) Date of Patent: Apr. 27, 2004

(54) BIT LINE SELECTION CIRCUIT HAVING HIERARCHICAL STRUCTURE

(75) Inventor: Jong Hoon Hong, Inchon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/254,478

(22) Filed: Sep. 25, 2002

(65) Prior Publication Data

US 2003/0067833 A1 Apr. 10, 2003

(30) Foreign Application Priority Data

Oct. 8, 2001 (KR) ........................................ 2001-61884

(51) Int. Cl.⁷ .............................. G11C 5/02; G11C 5/06; G11C 7/00
(52) U.S. Cl. ............................ 365/51; 365/63; 365/203
(58) Field of Search .......................... 365/51, 63, 203, 365/230.03, 230.06, 205, 207, 208

(56) References Cited

U.S. PATENT DOCUMENTS

| | | | | |
|---|---|---|---|---|
| 5,886,943 A | * | 3/1999 | Sekiguchi et al. ..... | 365/230.03 |
| 5,917,745 A | * | 6/1999 | Fujii ........................... | 365/63 |
| 5,923,605 A | * | 7/1999 | Mueller et al. ........ | 365/230.06 |
| 5,973,983 A | * | 10/1999 | Hidaka .................. | 365/230.03 |
| 6,088,286 A | * | 7/2000 | Yamauchi et al. ..... | 365/230.06 |
| 6,333,869 B1 | * | 12/2001 | Tanizaki et al. ........ | 365/230.03 |

* cited by examiner

Primary Examiner—Trong Phan
(74) Attorney, Agent, or Firm—Ladas & Parry

(57) ABSTRACT

Disclosed is a bit line selection circuit having hierarchical structure capable of preventing delay of operation speed due to signal loading by selecting a bit line with a sub bit line selection driver in a hierarchically shared bit line sense amp. The disclosed comprises: a bit line selection transistor unit for switching controlling a bit line between a cell array block and a bit line sense amp; a bit line equalizing signal generation unit for receiving a sense amp enable signal and a first and a second block signals and generating a bit line equalizing signal; a global bit line selection unit driven by output signal of the bit line equalizing unit and generating a first and a second global selection signals, a first and a second global selection bar signal and a bit line selection precharge signal; and a sub bit line selection driver unit for receiving the second global selection signal, the first global selection bar signal and the bit line selection precharge signal and generating a control signal controlling the bit line selection transistor unit.

7 Claims, 3 Drawing Sheets

BIT LINE SELECTION CIRCUIT HAVING HIERARCHICAL STRUCTURE

BACKGROUND OF THE INVENTION

1. Field of the Invention

The present invention relates to a bit line selection circuit having a hierarchical structure and, more particularly, to a bit line selection circuit having a hierarchical structure capable of preventing delay of operation speed due to signal loading by selecting a bit line using a sub bit line selection driver in a hierarchically shared bit line sense amp.

2. Description of Related Art

Generally, a sense amp can be divided into a bit line sense amp and a data bus line sense amp. The bit line sense amp senses and amplifies that fine data signals stored in cell array are loaded on a bit line BL and a bit bar line /BL and then, transmits it to data bus line DB and data bus line bar /DB. The data bus line sense amp amplifies again data loaded on the data bus line DB and the data bus line bar /DB and then, transmits it to data output buffer.

In order to read out data from semiconductor memory cell, a row address is inputted and then, word line corresponding to the address is enabled. After a predetermined time (tRCD), a bit line sense amp is operated to latch cell data of enabled word line. Subsequently, when a column address is inputted, data of selected bit line sense amp is transmitted to data line sense amp through data line and then, amplified and transmitted to data output buffer.

FIG. 1 is a drawing showing operation and structure of conventional bit line selection circuit comprising: cell array units 1a and 1b, bit line equalizing units BLEQ 2a and 2b, bit line sense amp unit 3, input output unit I/O 4, bit line selection transistors N4, N5, N6 and N7, and bit line selection signal generation units 5a and 5b.

The bit line selection transistors N4, N5, N6 and N7 are controlled by bit line selection signals BS0 and BS1, respectively, thereby operating a bit line selection transistor on the side of cell array unit selected by a column address signal 1a or 1b. The bit line selection signal generation units 5a and 5b generate the bit line selection signals BS0 and BS1 which has Vpp level when a bit line is selected, Vss level when a bit line is not selected and Vcc level when a bit line is precharged. That is, when the bit line is not selected, signal BSSUM0 (or BSSUM1 in 5a) inputted to the bit line selection signal generation unit 5a becomes 'logic high', thereby turning on N MOS transistor N3 and lowering voltage of node Nd4 to Vss.

On the other hand, when the bit line is not selected, the signal BSSUM0 inputted to the bit line selection signal generation unit 5a becomes 'logic low', thereby turning on P MOS transistor P2 and increasing voltage of node Nd4 to Vcc level with N MOS transistor N2 turned on. The input signal BSSUM0 having 'logic low' is inputted to NAND gate NA1 for inputting input signal N300 (or N301 in 5b) through inverter IV3-IN5 of 3 steps. The output signal of the NAND gate NA1 is level shifted through a level shifter unit 6, thereby signal of node Nd3 becomes 'logic low'. Therefore, the N MOS transistor N2 in turn on is turned off by the signal of the node Nd3 'low' and P MOS transistor P3 connected between Vpp and the node Nd4 is turned on by the signal of the node Nd3 'low', thereby increasing the node Nd4 to Vpp level. Therefore, it is possible to select bit line selection transistors N4 and N5 in the bit line sense amp (BLSA) unit 3 and to read cell data or write data on cell.

When BRSUM0 (or BRSUM1 in 5b) is high, the NMOS N1 and the PMOS P1 are switched on and allow the logical low or high signal of BSSUM0 (or BRSUM1 in 5b) to be received by the bit line selection signal generation unit 5a (or 5b). If on the other hand, BRSUM0 (or BRSUM1 in 5b) is high, both the P1 and N1 are switched off and do not allow the BSSUM0 (or BRSUM1 in 5b) signal to be received by the bit line selection signal generation unit 5a (or 5b).

However, the conventional bit line selection circuit has bit line selection transistors of many bit line sense amps in the selected bit line selection signal lines BS0 and BS1, whereby loading is increased since memory density is increased. As a result, operation speed is delayed.

SUMMARY OF THE INVENTION

Therefore, the present invention has been made to solve the above-mentioned problems and a primary objective of the present invention is to provide a bit line selection circuit having a hierarchical structure capable of preventing delay of operation speed due to loading of signal by selecting a bit line with a sub bit line selection driver in a hierarchically shared bit line sense amp structure.

In order to accomplish the above object, the present invention comprises: a bit line selection transistor unit for switching controlling a bit line between a cell array block and a bit lien sense amp; a bit line equalizing signal generation unit for receiving a sense amp enable signal and a first and a second block signals and generating a bit line equalizing signal; a global bit line selection unit driven by output signal of the bit line equalizing unit, for generating a first and a second global selection signals, a first and a second global selection bar signals and a bit line selection precharge signal; and a sub bit line selection driver unit for receiving the second global selection signal, the first global selection bar signal and the bit line selection precharge signal and generating a control signal controlling the bit line selection transistor unit.

Desirably, the sub bit line selection driver unit comprises: a pull up transistor for transmitting Vpp to a first signal line controlling the first bit line selection transistor unit by the first global selection bar signal; a pull down transistor for discharging a signal of the first signal line to ground voltage by the second global selection signal; and a precharge transistor for precharging the first signal line to source voltage by the bit line precharge signal. The pull up transistor comprises P MOS transistors. The pull down transistor comprises N MOS transistors. The precharge transistor comprises N MOS transistors.

Desirably, the bit line equalizing signal generation unit comprises flip flops comprising NOR gates for receiving the sense amp enable signal and a first and a second block signals. The global bit line selection unit receives and level shifts output signal of the flip flop and then, logic operates the level shifted signal to generate the first and second global selection bar signals and the bit line selection precharge signal.

BRIEF DESCRIPTION OF THE DRAWINGS

The above objects, and other features and advantages of the present invention will become more apparent after reading the following detailed description when taken in conjunction with the drawings, in which:

FIG. 4 is a circuit diagram of a bit line equalizing unit in FIG. 2;

FIG. 5 is a circuit diagram of a global bit line selection unit in FIG. 2; and

FIG. 6 is a drawing showing operation timing of signals in FIG. 2.

DETAILED DESCRIPTION OF THE INVENTION

Figure 1:
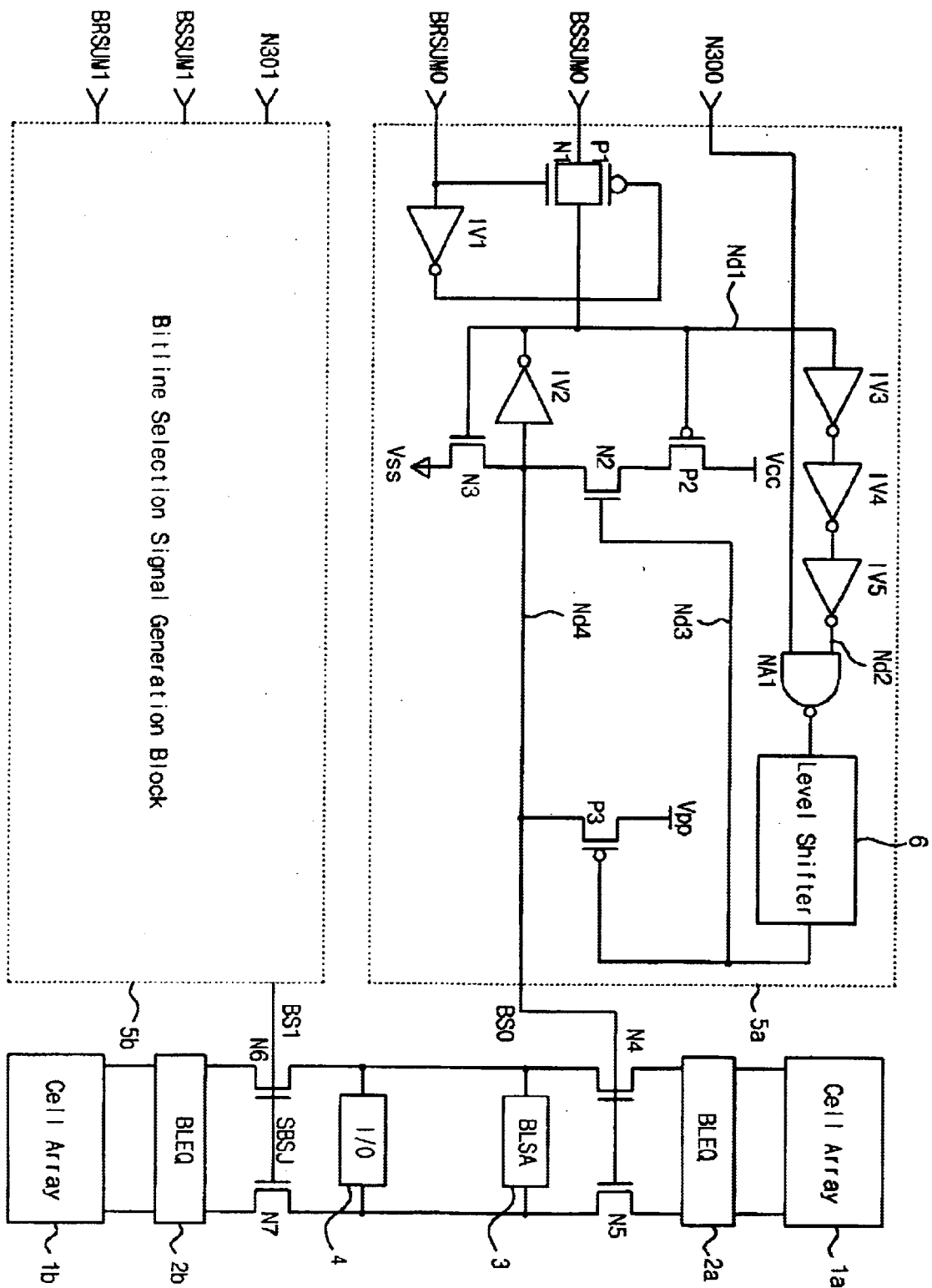
FIG. 1 is a drawing showing a bit line selection circuit according to a conventional method.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 2:
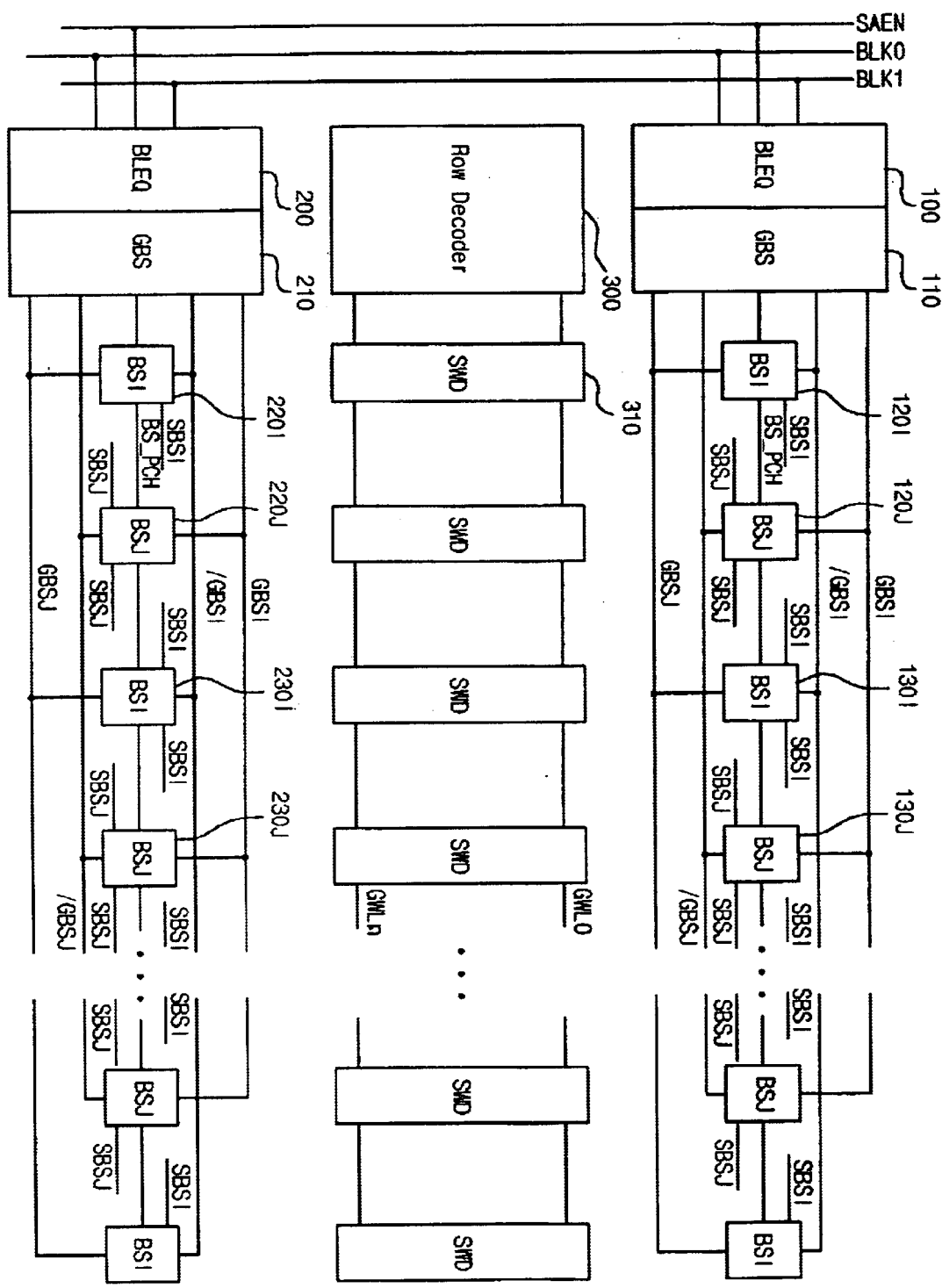
FIG. 2 is a drawing showing a bit line selection circuit according to the present invention.

FIG. 2 is a drawing showing a bit line selection circuit according to an embodiment of the present invention. The bit line selection circuit comprises bit line equalizing units 100 and 200, global bit line selection units 110 and 210, sub bit line selection driver units 120I, 120J, 130I, 130J, 220I, 220J, 230I, 230J (shown as BSI and BSJ in FIG. 2), a row decoder unit 300 and a sub word line driver unit 310. As shown in FIG. 2, BSI (such as 120I) and BSJ (such as 120J) are connected to the global bit line selection unit 110 in series in an alternating fashion.

The bit line equalizing units 100,200 receive a sense amp enable signal SAEN and block signals BLK0,BLK1 to generate a bit line equalizing signal and the global bit line selection units 110,210 are driven by signal from the bit line equalizing units 100,200 to generate global selection signals GBSI, /GBSJ, /GBSI, /GBSJ and a bit line selection precharge signal BS_PCH.

The sub bit line selection driver units 120I,220I receive the global selection signals GBSJ,/GBSI and the bit line selection precharge signal BS_PCH to generate a signal SBSI controlling the first bit line selection transistor unit and the sub bit line selection driver units 120J,220J receive the global selection signals GBSI,/GBSJ and the bit line selection precharge signal BS_PCH to generate a signal SBSJ controlling a second bit line selection transistor unit.

And, the row decoder unit 300 receives a row address to generate a plurality of signals GWL0-GWLn to control the operation of a series of the sub word line driver units 310 (shown as SWD in FIG. 2). The sub word line driver unit 310 selects and drives word line of memory cell array.

Figure 3:
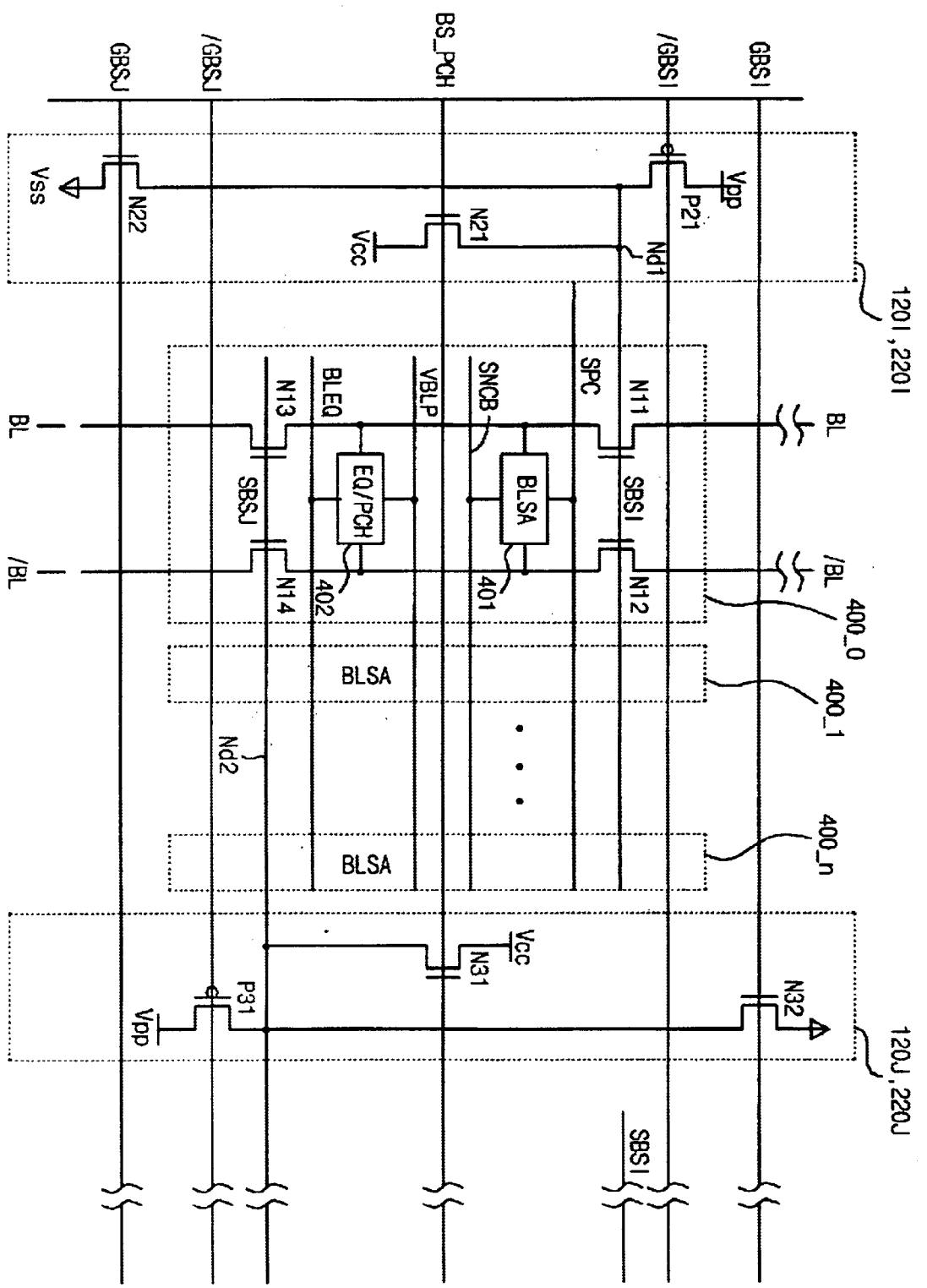
FIG. 3 is a drawing showing a bit line sense amp block unit including a sub bit line selection driver unit and a bit line selection transistor in FIG. 2.

FIG. 3 is a drawing showing a plurality of bit line sense amp units 400_0, 400_1 to 400$_{13}$n including sub bit line selection driver units 120I,120J,2201,220J and bit line selection transistor in FIG. 2.

As shown in the drawing, the bit line sense amp units 400_0 comprise: first bit line selection transistor units N11, N12 arranged on upper cell array unit (not shown); second bit line selection transistor units N13, N14 arranged on lower cell array units (not shown); a bit line sense amp (BLSA) unit 401 connected between the first bit line selection transistor units N11, N12 and the second bit line selection transistor units N13, N14; and a bit line equalize/precharge (EQ/PCH) unit 402.

The sub bit line selection driver unit comprises: first sub bit line selection driver units 120I,220I for controlling operation of the first bit line selection transistor units N11 and N12; and second sub bit line selection driver units 120J and 220J for controlling operation of the second bit line selection transistor units N13 and N14.

The first sub bit line selection driver units 120I, 220I comprise: a pull up transistor P21 comprising P MOS transistors for transmitting Vpp to node Nd1 transmitting a signal (SBSI) controlling the first bit line selection transistor units N11 and N12 (FIG. 3) when the global selection signal /GBSI is 'low'; a pull down transistor N22 comprising NMOS transistors for discharging a signal of the node Nd1 to Vss when the global selection signal GBSJ is 'high'; and a precharge transistor N21 comprising N MOS transistors for discharging the node ND1 to Vcc when the bit line precharge signal BS_PCH is 'high'.

The second sub bit line selection driver units 120J and 220J comprises: a pull up transistor P31 comprising P MOS transistors for transmitting Vpp to node Nd2 transmitting a signal SBSJ controlling the second bit line selection transistor units N13 and N14 (FIG. 3) when the global selection signal /GBSJ is 'low'; a pull down transistor N32 comprising N MOS transistor for discharging a signal of the node Nd2 to Vss when the global selection signal GBSI is 'high'; and a precharge transistor N31 comprising N MOS transistors for precharging the node Nd2 to Vcc when the bit line precharge signal BS_PCH is 'high'.

The operation of first and second sub bit line selection driver units 120I, 220I, 120J and 220J will be described in more detail.

When a bit line is not selected, the global bit line selection signals GBSI and GBSJ become 'low' and the bit line precharge signal BS_PCH becomes 'high', thereby turning on precharge transistors N21 and N31 of the sub bit line selection driver units 120I, 220I, 120J and 220J and precharging signals of the nodes Nd1 and Nd2 to Vcc.

When the bit line is selected, the bit line precharge signal BS_PCH becomes 'low' and if the global bit line selection signal GBSI is selected in the global bit line selection signals GBI,GBSJ, the global bit line selection signal GBSI becomes 'high' and the global bit line selection signal /GBSI becomes 'low'.

Therefore, the pull up transistor P21 of the first sub bit line selection driver units 120I,220I is driven, thereby increasing the node Nd1 to Vpp and the pull down transistor N22 of the second sub bit line selection driver units 120J,220J is driven, thereby lowering the node Nd2 to Vss.

FIG. 4 is a circuit diagram of bit line equalizing signal generation units 100, 200 in FIG. 2. As shown in the drawing, the global bit line selection units 110, 210 comprise: a NOR gate G1 to which a block signal BLK0 and a sense amp enable signal SAEN are inputted; a NOR gate G2 to which the sense amp enable signal SAEN and a block signal BLK1 are inputted; a NOR gate G3 for 2 to which the output signal A of the NOR gate G1 and signal D of node Nd2 are inputted; a NOR gate G4 to which the output signal B of the NOR gate G2 and signal C of node Nd1 are inputted; an inverter G5 for receiving the output signal C of the NOR gate G3 and generating an inverted signal /BEQENI; and an inverter G6 for receiving the output signal D of the NOR gate G4 and generating an inverted signal /BEQENJ.

FIG. 5 is a circuit diagram of global bit line selection units 110,210 in FIG. 2. As shown in the drawing, the global bit line selection units 110,210 comprise: inverters G7,G8 connected in a series between a terminal for receiving an output signal /BEQENI of the bit line equalizing signal generation units 100,200 and node Nd3; a level shifter unit 111 for receiving output signal of the inverter G8 and generating a level shifted signal to node Nd4; inverters G12,G13 connected in a series between a terminal for receiving an output signal /BEQENJ of the bit line equalizing signal generation units 100,200 and node Nd6; a level shifter unit 112 for receiving an output signal of the inverter G13 and generating a level shifted signal to node Nd7; inverters G9,G10 connected in a series between an output node Nd4 of the level shifter unit 111 and a node Nd5 for transmitting a global bit line selection signal /GBSI; an inverter G11 for receiving a signal /GBST of the node Nd5 and generating an inverted global bit line selection signal GBSI; inverters G14,G15 connected in a series between an output node Nd7 of the level shifter unit 112 and a node Nd8 for transmitting a global bit line selection signal /GBSJ; an inverter G16 for receiving a signal /GBSJ of the node Nd8 and generating an inverted global bit line selection signal GBSJ; a NAND gate G17 for 2 input of signals of the node Nd4 and node Nd7; a NAND gate G18 for 2 input of signals of the node Nd5 and the node Nd8; and a NOR gate G19 for 2 input of an output signal Nd10 of the NAND gate G18 and an output signal of the NAND gate G17 to generate the bit line selection precharge signal BS_PCH. The level shifter units 111,112, the inverters G9-G11,G14-G16, the NAND gates G17,G18 and the NOR gate G19 employ Vpp as source voltage.

When the output signal /BEQENI of the bit line equalizing signal generation units 100,200 is 'high' and the output signal /BEQENJ is 'low', the global bit line selection signal /GBSI becomes 'high' (Vpp), the global bit line selection signal GBSI becomes 'low' (Vss), the global bit line selection signal /GBSJ becomes 'low' (Vss), the global bit line selection signal GBSJ becomes 'high' (Vpp) and the bit line selection precharge signal BS_PCH becomes 'low' (vss).

When the output signal /BEQENI of the bit line equalizing signal generation units 100,200 is 'low' and the output signal /BEQENJ is 'high', the global bit line selection signal /GBSI becomes 'low' (Vss), the global bit line selection signal GBSI becomes 'high' (Vpp), the global bit line selection signal /GBSJ becomes 'low' (Vss) and the bit line selection precharge signal BS_PCH becomes 'low' (Vss).

When the output signal /BEQENI of the bit line equalizing signal generation units 100,200 is 'high' and the output signal /BEQENJ is 'high', the global bit line selection signal /GBSI becomes 'high' (Vpp), the global bit line selection signal GBSI becomes 'low' (Vss), the global bit line selection signal /GBSJ becomes 'high' (Vpp), the global bit line selection signal GBSJ becomes 'low' (Vss) and the bit line selection precharge signal BS_PCH becomes 'high' (Vpp).

FIG. 6 is a drawing showing operation timing of signals in FIG. 2.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A bit line selection circuit having a hierarchical structure of semiconductor memory device comprising:

a bit line selection transistor unit for switching-controlling a bit line between a cell array block and a bit line sense amp;

a bit line equalizing signal generation unit for receiving a sense amp enable signal and a first and a second block signals and generating a bit line equalizing signal;

a global bit line selection unit driven by output signal of the bit line equalizing unit and generating a first and a second global selection signals, a first and a second global selection bar signal and a bit line selection precharge signal; and a sub bit line selection driver unit for receiving the second global selection signal, the first global selection bar signal and the bit line selection precharge signal and generating a control signal controlling the bit line selection transistor unit.

2. The bit line selection circuit according to claim 1, wherein the sub bit line selection driver unit comprises:

a pull up transistor for transmitting Vpp to a first signal line controlling the first bit line selection transistor unit by the first global selection bar signal;

a pull down transistor for discharging a signal of the first signal line to ground voltage by the second global selection signal; and a precharge transistor for precharging the first signal line to source voltage by the bit line precharge signal.

3. The bit line selection circuit according to claim 2, wherein the pull up transistor comprises P MOS transistors.

4. The bit line selection circuit according to claim 2, wherein the pull down transistor comprises N MOS transistors.

5. The bit line selection circuit according to claim 2, wherein the precharge transistor comprises N MOS transistors.

6. The bit line selection circuit according to claim 1, wherein the bit line equalizing signal generation unit comprises flip flop including NOR gates for receiving the sense amp enable signal and a first and a second block signals.

7. The bit line selection circuit according to claim 1, wherein the global bit line selection unit receives and level shifts an output signal of the flip flop and then, logic operates the level shifted signal to generate the first and the second global selection signals, the first and the second global selection bar signals and the bit line selection precharge signal.

* * * * *

UNITED STATES PATENT AND TRADEMARK OFFICE
CERTIFICATE OF CORRECTION

PATENT NO. : 6,728,125 B2  Page 1 of 2
APPLICATION NO. : 10/254478
DATED : April 27, 2004
INVENTOR(S) : Jong Hoon Hong It is certified that error appears in the above-identified patent and that said Letters Patent is hereby corrected as shown below:

Include Figures 4-6 as follows:

FIG.4

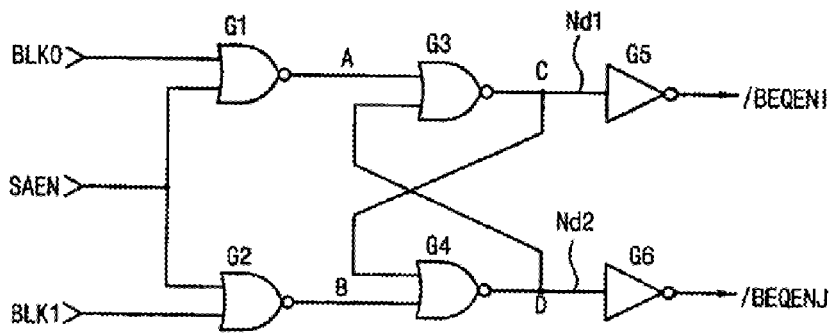

FIG.5

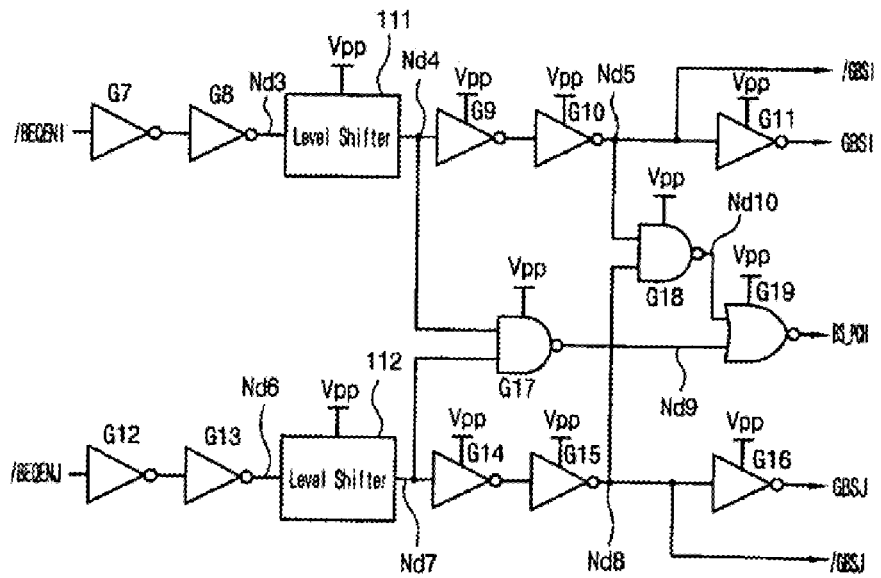

UNITED STATES PATENT AND TRADEMARK OFFICE
CERTIFICATE OF CORRECTION

PATENT NO. : 6,728,125 B2 Page 2 of 2
APPLICATION NO. : 10/254478
DATED : April 27, 2004
INVENTOR(S) : Jong Hoon Hong It is certified that error appears in the above-identified patent and that said Letters Patent is hereby corrected as shown below:

Include Figures 4-6 as follows:

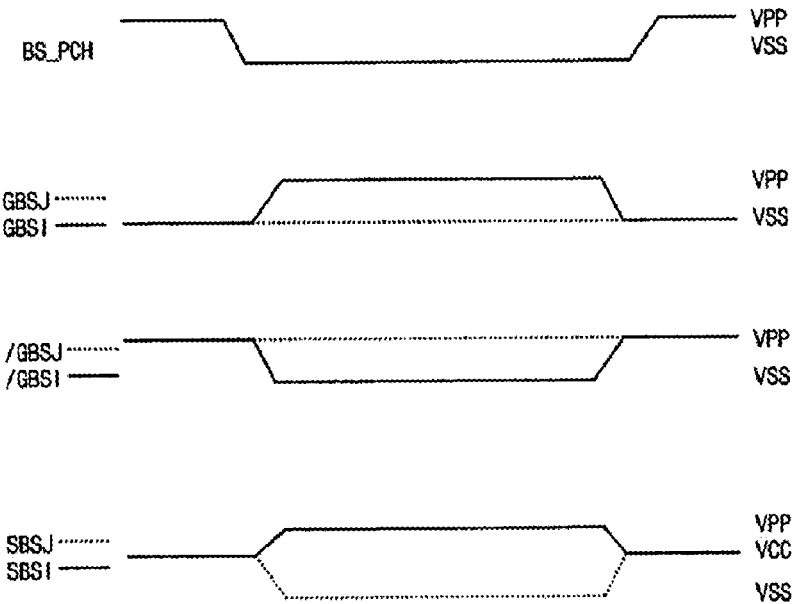

FIG.6

Signed and Sealed this

Twenty-sixth Day of February, 2008

JON W. DUDAS
*Director of the United States Patent and Trademark Office*